United States Patent [19]
Holowko

[11] Patent Number: 6,081,820
[45] Date of Patent: Jun. 27, 2000

[54] METHOD AND APPARATUS FOR FILTERING A SIGNAL USING A WINDOW VALUE

[75] Inventor: Paul L. Holowko, Dayton, Ohio

[73] Assignee: Siemens Energy & Automation, Alpharetta, Ga.

[21] Appl. No.: 09/026,860

[22] Filed: Feb. 20, 1998

[51] Int. Cl.[7] .............................. G06F 17/10; G06F 7/00; G06F 7/50

[52] U.S. Cl. ......................... 708/300; 708/207; 708/671

[58] Field of Search .................................. 708/207, 671, 708/300; 340/146.2

[56] References Cited

U.S. PATENT DOCUMENTS

| | | |
|---|---|---|
| 3,354,452 | 11/1967 | Bard et al. . |
| 3,439,336 | 4/1969 | Toiff et al. .............................. 708/671 |
| 3,662,163 | 5/1972 | Miller et al. . |
| 3,699,318 | 10/1972 | Underkoffler et al. . |
| 3,793,630 | 2/1974 | Meijer . |
| 3,824,585 | 7/1974 | Meijer . |
| 3,896,431 | 7/1975 | Dickinson . |
| 3,939,459 | 2/1976 | Hoopes . |
| 4,064,396 | 12/1977 | Panarello . |
| 4,760,374 | 7/1988 | Moller ..................................... 708/207 |
| 5,047,769 | 9/1991 | Engeler et al. . |
| 5,196,851 | 3/1993 | Patel et al. . |
| 5,260,680 | 11/1993 | Glass .................................... 340/146.2 |
| 5,278,558 | 1/1994 | Roth . |
| 5,381,148 | 1/1995 | Mueck et al. . |
| 5,412,385 | 5/1995 | Mangelsdorf . |
| 5,432,514 | 7/1995 | Mukuda et al. . |
| 5,440,305 | 8/1995 | Signore et al. . |
| 5,457,645 | 10/1995 | Suzuki .................................... 708/207 |
| 5,524,251 | 6/1996 | Urasaki ................................... 708/207 |
| 5,726,923 | 3/1998 | Okumura et al. ....................... 708/207 |
| 5,867,408 | 2/1999 | Chauvel et al. ........................ 708/207 |
| 5,905,665 | 5/1999 | Rim ........................................ 708/671 |

OTHER PUBLICATIONS

ProSeries II Rapid Acquisition Controller hand–held acquisition meter having a filter routine in the Digital Signal Processing (DSP) portion of the meter. The meter was sold by Pro–Measure Corp. around Nov. of 1995. (See attached Declaration of Paul L. Holowko).

*Primary Examiner*—Tan V. Mai
*Attorney, Agent, or Firm*—Dinsmore & Shohl LLP

[57] ABSTRACT

An apparatus and method for filtering and stabilizing a signal by using a window value is provided. The signal is sampled and each sample of the signal is input to the method or apparatus and compared to the previous output. If the difference between the input sample and the previous output is less than the window value, then the previous output is provided as the next output. However, if the difference between the reference sample and the input sample is greater than the window value, then the input sample is provided as the next output. Thus, the method and apparatus provide a constant output until the difference between the input sample and that output is greater than the window value, at which time the input sample is provided as the new output. In a preferred application, the invention can be used as a digital filter and can be embodied in the form of software, such as, for example, a C program.

23 Claims, 4 Drawing Sheets

METHOD AND APPARATUS FOR FILTERING A SIGNAL USING A WINDOW VALUE

TECHNICAL FIELD

This invention relates to apparatus and methods for filtering a signal, and, more particularly, to an efficient filtering apparatus and method wherein the output of the filter is kept constant until the difference between the signal and the previous output of the filter is greater than a window value.

BACKGROUND OF THE INVENTION

It is well known that the output of an electrical device can be adversely affected by interference from other nearby devices and signals. Such noise can be particularly problematic when the output of the device is used to control a system over which very precise and tight control is desired, such as in injection molding machines and the like.

Over the years, a variety of processing methods and apparatuses have been implemented for filtering signals so as to improve the stability of the signal and/or reduce noise and errors that may have been introduced into the signal. A filter is basically a system or method that selectively changes the waveshape, amplitude-frequency and/or phase-frequency characteristics of a signal in a desired manner. Such filters include highpass filters, polar filters, and Butterworth filters, and can involve a number of analog electronic circuits as well as mathematical models and techniques, such as Fourier transformations.

Although filters have been developed for the processing of both analog and digital signals, digital filters have become increasingly important due to the growing popularity of utilizing digital signals as opposed to analog signals. Signals in digital form are now widely used because the signal can be easily saved and utilized in a digital computer, and because digital signal processing has become extremely reliable, efficient, and powerful. However, even digital signals are vulnerable to the effects of noise which can interfere with the analog signal and/or the signal in digital form, as well as roundoff noise that can be incurred in converting the analog signal to digital form.

Accordingly, a variety of digital filters have been developed to combat the effects of noise on digital signals. A digital filter refers to hardware or software that performs a mathematical algorithm that operates on the digital input signal to produce a digital output signal for the purpose of achieving a filtering objective. Once the analog signal is sampled periodically and converted into digital form by an analog-to-digital convertor (or ADC), the digital filter implements the filtering operation in accordance with the computational algorithm for the filter. Once the processing of the digital signal is complete, a digital-to-analog convertor (or DAC) can convert the filtered digital signal into an analog value which can again be filtered to smooth the signal and remove unwanted noise.

While digital filters can be very beneficial in digital signal processing, they are not without limitations. Such filters can be extremely complex. Typically, the input and output signals of such filters are related by complex difference equations that include convolution sums. Although computer software and/or hardware are utilized to solve these complex equations, the use of such filtering algorithms requires the computer to make a number of mathematical calculations per filtering cycle, and also requires a sizable amount of data storage capacity for storing the filter coefficients and filter data. Of similar complexity is the design of the appropriate digital filter, which requires the computation of filter coefficients by using particular methods, such as the impulse invariant method or bilinear transformation method, and the realization of the filter into a suitable structure, such as a lattice structure or cascade structure.

As can be easily understood, these complexities contribute to the disadvantages of using digital filters. The speed of a digital filter can be limited by the complexity and number of arithmetic operations that must be performed by the filtering algorithm, which must increase as filter response is made tighter. Moreover, the design and development time for such filters, especially hardware development, can be large.

At least one less complex filtering method has been developed. According to the method, anytime the input number is greater than a predetermined range, the input number would be provided as the output of the filter, and the range would be shifted to the right such that the input number would become the upper "edge" of the range (i.e., the highest number in the range). Similarly, anytime the input number would be less than the range, the input number would be provided as the output, and the range would be shifted left such that the input number would become the lower "edge" of the range (i.e., the lowest number in the range). However, whenever the input number fell within the range, the input number would not be output, and, rather, the last number output from the routine would be provided as the filter output. It has also been know to use a "shift and add" averaging routine in combination with this filter. According to this additional routine, the "n" least significant bits of the previous $2^n$ incoming samples were truncated and the resulting $2^n$ numbers were added to produce a new number. The number selected for "n" could be varied based upon the particular use contemplated.

While these filtering methods decrease the complexity of previous filters, they are not without disadvantages. The first method does not adequately suppress increases or spikes in the signal. Whenever a spike occurs that falls outside of the window range, the range will shift right (i.e., toward the positive direction) and that spike will become the upper "edge" of the range. However, any additional noise that is greater in amplitude than that edge will not be suppressed, and even a slight upward drift in the signal that happens to be greater than the spike would not be stabilized by the method. Due to this effect, instability and imprecision in the filter output can result. The same is true for any low points or lulls in the signal. The first low point that falls outside of the range would cause the range to shift left (i.e., toward the negative direction), and the low point would become the lower "edge" of the new range. However, any future low points that fall below this edge, such as can be caused by a drift in the signal, would not be stabilized by the method.

In addition, the "shift and add" layer of filtering can lead to imprecision and inaccuracy, as the truncating of the least significant bits can create large errors in the signal. While the precision can be increased by increasing the number of samples added, this solution slows the process significantly.

Accordingly, there is a continuing need for effective filters that, in comparison to conventional filters, require less complex hardware and/or software(and, thus, can be produced at lower cost), can operate at faster speeds (and thus can handle signals of higher bandwidth), require less storage capacity and processing time, and can be easily changed and adapted to fit a particular application. Moreover, there is a need for such a filter that provides better stability than the "edge" type of filter, such that drifts and changes in both the positive and negative direction are stabilized. In addition, an additional filtering layer is desired which provides greater precision than the "shift and add" type of filter.

SUMMARY OF THE INVENTION

It is an object of this invention to obviate the above-described problems.

It is another object of the present invention to provide a method and apparatus that can effectively filter a signal in a relatively simple and direct manner.

It is a further object of the present invention to provide a method and apparatus for filtering a signal, preferably a digital signal, that require less design and development time per application.

Another object of the present invention is to provide a method and apparatus for filtering a signal that can be implemented, preferably in hardware and/or software, with a relatively small amount of equipment, code, and cost.

A further object of the present invention is to provide a method and apparatus for filtering a signal that, in comparison to conventional filters, can operate at higher speeds, and require fewer computations, and less processing time, and memory.

It is yet another object of the present invention to provide a method and apparatus for filtering a signal that can be quickly and easily adjusted for use in a variety of applications.

Another object is to provide a filter which provides increased stability, even in the presence of signal spikes and drifts in the incoming signal.

It is an object of the invention to provide a filter which can stabilize both positive and negative drifts or other changes in a signal.

An additional object is to provide a filter which provides increased precision and accuracy.

To achieve the foregoing and other objects, and in accordance with the purposes of the present invention as described above, a method for filtering a signal is provided comprising the steps of obtaining an input, obtaining a previous output, determining a relationship between the previous output, the input, and a window value, and providing an output based upon the relationship. The input corresponds to a portion of the output of the device. The output is equal to the previous output if the input is within a range of deviation, and the output is equal to the input if the input is outside of the range. The range of deviation is at least partially defined by the window value and includes a lower limit and an upper limit, the previous output being less than the upper limit and greater than the lower limit.

Preferably, the window value completely defines whether the input sample is sufficiently close or sufficiently different from the previous output (or other reference that may be utilized). It is also preferred that the relationship determination is made by comparing the window value to the difference between the reference sample (such as the previous output) and the input sample, and the output sample is set equal to the reference sample when the window value is greater than the difference, and set equal to the input sample when the window value is less than the difference.

In accordance with another aspect of the invention, an apparatus for stabilizing the output of a device is provided comprising an output storage element for providing a stored output signal, and an evaluation element. The evaluation element receives a window signal, a device output signal corresponding to the output of the device, and the stored output signal, and provides an output signal. The output of the evaluation element is equivalent to the device output signal when the difference between the device output signal and the stored output signal is greater than the window signal. The output of the evaluation element is equivalent to the stored output signal when the difference between the device output signal and the stored output signal is less than the window signal. Preferably, the evaluation element comprises a pair of comparators, an adder, a subtractor, and a logic element. It is also preferred that the stored output signal is equal to the previous output of the apparatus.

BRIEF DESCRIPTION OF THE DRAWINGS

While the specification concludes with claims particularly pointing out and distinctly claiming the present invention, it is believed the same will be better understood from the following description taken in conjunction with the accompanying drawings in which:

DETAILED DESCRIPTION OF THE PREFERRED EMBODIMENTS

Figure 1:
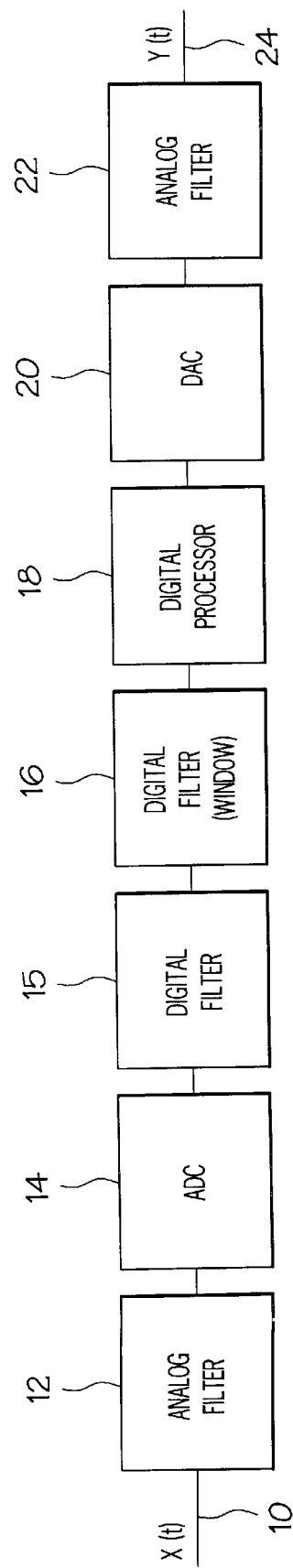
FIG. 1 is a schematic view of an environment in which the method and apparatus, of the present invention can be practiced.

Referring now to the drawings in detail, FIG. 1 illustrates a preferred environment in which the window filter 16 of the present invention may be applied. In this environment, an analog signal is received at input 10 and filtered in the desired manner by analog filter 12. The output of the analog filter 12 is fed to an analog-to-digital convertor 14, which samples the analog input and converts it into digital form. A first digital filter 15 can then be utilized to provide a first layer of digital filtering to the digital signal output from the ADC 14.

After this first layer of digital filtering, the digital signal is fed to a second digital filter 16, which comprises an embodiment of the present invention. The output of the filter 16 is then ready for processing by a digital processor 18, which may apply any of a number of digital signal processing algorithms and/or computations to the signal. After this processing, the signal can then be fed to a digital-to-analog convertor 20, which is utilized to convert the digital signal into an analog form, and then to another analog filter 22 for final filtering. The output of the analog filter 22 is provided at output 24.

While it is preferred that the apparatus and method of the present invention be used to filter and stabilize a digital signal, such as through the use of digital filter 16 of FIG. 1, the invention may be used to filter other signals as well. Moreover, with regard to FIG. 1, in some applications, the signal may already be in digital form, in which case filter 12 and ADC 14 would not be needed. Similarly, the digital output of filter 18 may not need to be converted to analog form (such as, for example, if the signal is to be stored in computer memory for later use, or displayed on a display device), in which case DAC 20 and analog filter 22 would not be needed. Moreover, the window filter 16 may be utilized as the sole means of filtering, and, accordingly, does not need to be used in conjunction with other filters.

The filter and filtering method of the present invention may be utilized in a number of machines, devices, and processes. For example, the present invention may be utilized to process signals in industrial machines, such as feedback signals fed to PID controls in injection molding machines, machine tools, and the like, or to process signals in consumer items, such as the audio signals in radios and CD players. The filter may also be used to smooth or stabilize data obtained from a variety of processes and devices. Moreover, the invention may take on a number of forms, such as, for example, computer software and/or hardware, along with other electrical and digital devices.

Figure 2:
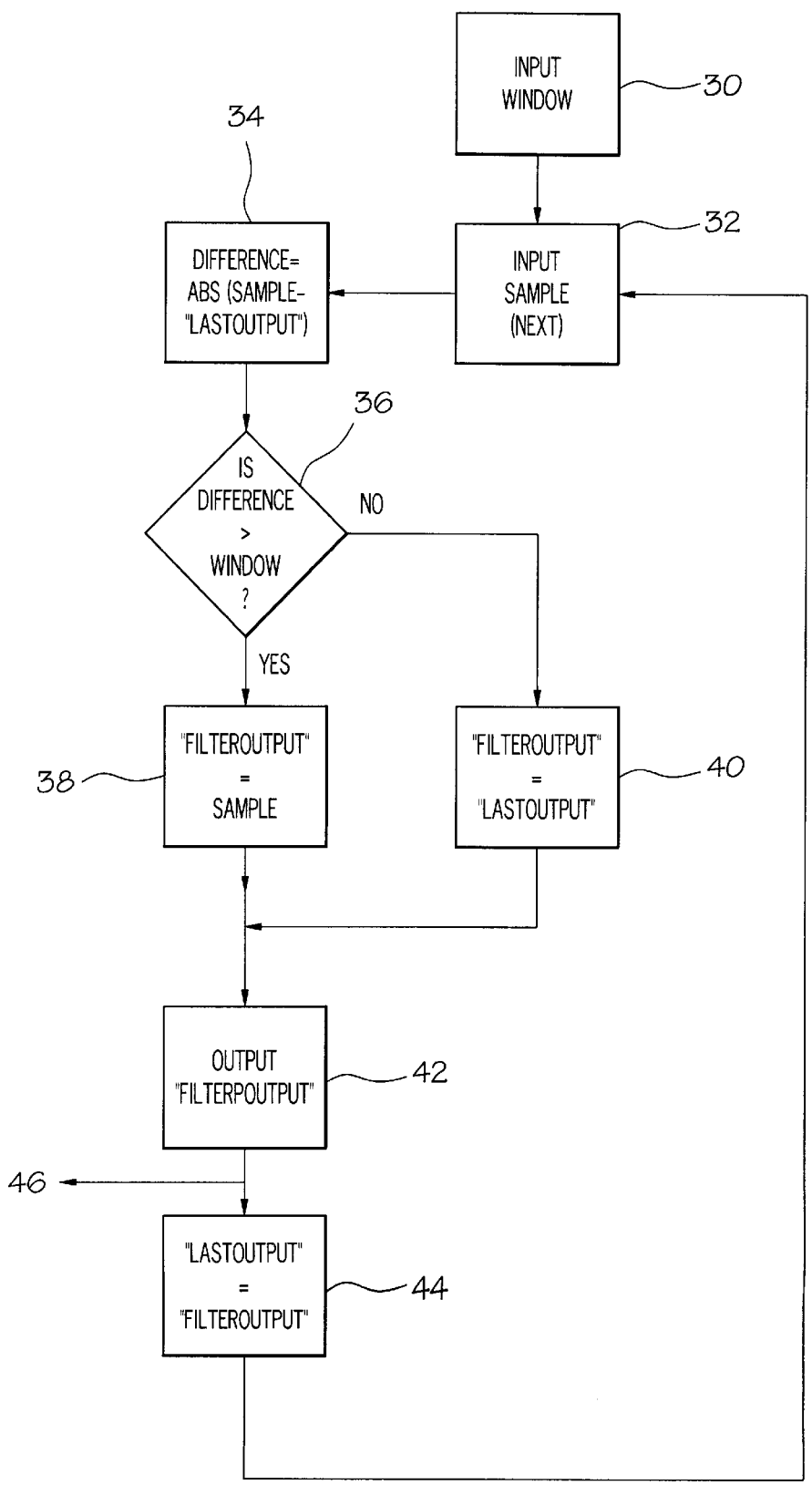
FIG. 2 is a flow diagram illustrating a method for filtering a signal using a window value, according to one embodiment of this invention.

FIG. 2 is a flow diagram illustrating one embodiment of the filtering method of the present invention. The method according to this invention can be embodied as an article of manufacture by configuring the method as a program on a computer readable medium, such as a floppy disk, CD-ROM or other persistent storage medium. The method can also be embodied as a special purpose apparatus having executable instructions suitable for carrying out the invention stored in a RAM or ROM, or a combination of both. Moreover, the method can be implemented in any conventional programming language, such as, for example, C, C++, or Basic, or can be implemented in a special purpose programming language. Preferably, the program is implemented in C programming language.

Upon execution of the method of FIG. 2, block 30 is executed and the size of the "window" utilized in the filter is obtained. This window comprises a signal, sample, variable, or constant having a particular value. As will be understood, the larger the value of the window, the more noise that is suppressed by the method, and the more stable the output of the filter. However, a large window value also means that the output of the method will have less resolution and accuracy. The value of the window can be obtained from the user of the method, from a separate software routine or data location, or from another signal source.

At block 32, a sample of the signal to be filtered is obtained, or input. If the signal to be filtered is a digital signal, as in a preferred embodiment, this sample comprises a data value, or word, that has a particular magnitude and that is represented by a number of bits, as known in the art. A plurality of such samples represent the digital signal itself, and the digital signal represents an analog signal sampled at discrete moments in time. However, it is to be understood that the sample may represent and take the form of other signals and/or values as well.

The sample received at block 32 can be loaded directly from an ADC, from a database having such samples stored therein, or from some other signal source. It is this sample upon which the method will operate, and, thus, the sample can be referred to as the input sample.

After the sample is obtained at block 32, the difference between the sample and the previous output of the method is calculated at block 34. The previous output of the method represents the output of the method during the iteration of the method preceding the present iteration, and is used as a reference signal or reference sample for the method. This previous output can be stored in a memory location or data base and can be represented by a data array or variable, as in FIG. 2, wherein it is represented by the variable "last output." If no previous iteration exists (e.g., this is the first iteration of the method since execution or initialization), the variable can be assigned a predetermined value, such as a random value. Alternatively, the variable can take on the number that currently resides in the storage register for the variable. As another alternative, on the first iteration of the method, blocks 34 and 36 can be skipped, and blocks 38, 42, and 44 can be executed, which will simply allow the input sample to be output and will set the variable "last output" equal to the input sample.

It should be noted that, at block 34, the absolute value of the difference between the sample and the last output is determined, as it is the magnitude of this difference that is of importance to the method. Also, by taking the absolute value, it is ensured that the last output (or reference sample) is disposed at the center of the window, or range of deviation (i.e., that stability is provided in both the positive and negative directions).

At block 36, the difference between the sample and the last filter output is compared to the window value that was input at block 30. If the difference is greater than the window value, then block 38 is executed wherein the variable "filter output" is set equal to the sample which was input at block 32. If this difference is less than or equal to the window value, then block 40 is executed wherein the "filter output" is set equal to the variable "last output". It is to be understood that other relationships between the sample, the window value, and the last filter output can be determined at blocks 34 and 36 without departing from the scope of the invention. Any method of determining whether the sample is sufficiently close to the last output is within the scope of the present invention. One way to so is to multiply the last output by a constant value and determine whether the input sample is greater and/or less than the result of the multiplication. As illustrated at blocks 34 and 36, a preferred method is to determine if the input sample exceeds the last output (i.e., the reference sample) by more than the predetermined window value.

Also, it should be noted that, while the embodiment shown in FIG. 2 sets the filter output equal to the last output when the difference is equal to the window value, the filter output may be set equal to the input sample when the difference equals the window value, without departing from the scope of the invention.

At block 42, the "filter output" variable is provided (or output) so that it may be used or analyzed, such as, for example, by displaying the value of the variable on a memory device, by providing the value as a signal on an output port, or by allowing the variable to be used by a user or another program. Block 44 is then executed wherein the variable "last output" is set equal to the variable "filter output", so that it may be used during the next iteration of the method. After block 44, this next iteration is commenced and the next sample to be processed is obtained at block 32 (i.e., after block 44, the process returns to block 32 for operation on the next sample or signal).

As can be understood, this embodiment of the present invention maintains a constant output signal until the difference between a particular input sample and the constant output signal is greater than the window value, at which time the output will change, preferably to equal that particular input sample. The method is reiterated on subsequent samples and this new output will be maintained until an input sample is encountered that falls outside of the "window", or range. According, in this embodiment, the variable "last output", which represents the previous output of the method, serves as a reference to which each sample is compared. However, other references may be used without departing from the scope of the invention The following serves as an example of the method of FIG. 2: If the user defines the window size as 10, and the first sample is 30, the filter will provide 30 as its output until a sample is obtained that is greater than 40 or less than 20. Thus, if a sample is encountered that is equal to 19, the filter makes 19 its new output and maintains this output until a sample is encountered that is greater than 29 or less than 9. Of course, these numbers would be provided in binary or hexadecimal form in practice. This example is depicted by the following table:

| Time | Sample Obtained (e.g. from ADC) | Output of Method |
| --- | --- | --- |
| T1 | 30 | 30 |
| T2 | 28 | 30 |
| T3 | 24 | 30 |
| T4 | 29 | 30 |
| T5 | 22 | 30 |
| T6 | 23 | 30 |
| T7 | 19 | 19 |
| T8 | 20 | 19 |
| T9 | 22 | 19 |
| T10 | 23 | 19 |

Figure 3:
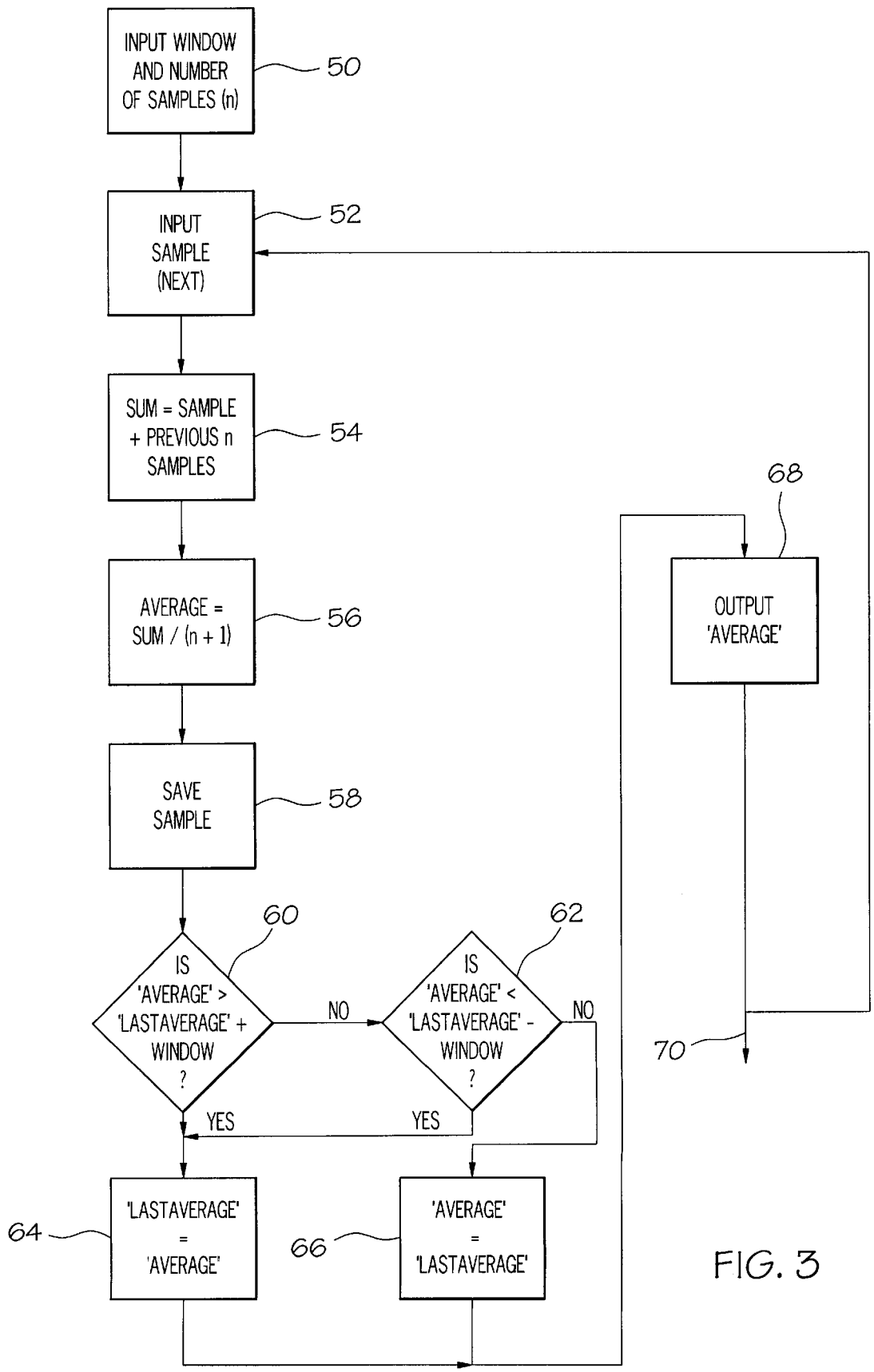
FIG. 3 is a flow diagram illustrating another embodiment of the present invention in which dual layers of filtering are utilized, one of the layers being similar to the method illustrated in the diagram of FIG. 2.

As indicated in FIG. 1, the method of the present invention may also be utilized with other filtering or signal processing methods, such that additional layers of error correction and stability are provided. The flow diagram of FIG. 3 depicts such "dual filtering", wherein blocks 54, 56, and 58 relate to a first method of filtering, which utilizes a moving average, while blocks 60, 62, 64, and 66 relate to a second method of filtering, which utilizes another embodiment of the method of FIG. 2.

At block 50, the window value and number of samples (shown as "n") are obtained, the window value being used in the second layer of filtering and the number of samples "n" being utilized in the first layer. The window value is used in the same manner as described in FIG. 2, and the value of "n" determines the number of samples that will be combined with the current sample to calculate an average value. Both values can be set by a user according to the desired characteristics of the filter.

At block 52, the sample to be filtered or processed by the method is obtained. Then, at block 54, the sum of the input sample and the previous samples is obtained. The number of previous samples that are included in the sum is determined by the value "n" input at block 50. The sum is then used at block 56 to calculate an average (which, in FIG. 3, is assigned as the variable "average"), the average being equal to the sum divided by (n+1). At block 58, the input sample is saved, preferably in an array, for use in averaging other input samples during other iterations of the method. Thus, blocks 54, 56, and 58 correspond to a "moving average" type of filter that can be used in conjunction with the filter depicted in FIG. 2.

As an alternative to this first layer of filtering, if all data samples corresponding to the digital signal have been received and stored, this filtering method can be modified such that samples that were received previously and subsequently are used in calculating the average. Thus, a circular averaging technique can be utilized, by utilizing a circular buffer which contains values received both before and after the sample input at block 52, the number of values stored in the buffer being determined by the number "n" which is input at block 50. As an alternative to a circular buffer, a linear buffer or finite buffer may be utilized.

The output of the first filter is then fed through a second filter, represented by blocks 60, 62, 64, and 66, so that a second layer of filtering is provided. These blocks illustrate one alternative to the embodiment illustrated in FIG. 2. At block 60, the variable "average", calculated from the first filtering layer, is compared to a sum, the sum being equal to the last output of the dual filter, indicated in the drawing as the variable "last average", plus the window value. Similarly, at block 62, the average is compared to a difference, the difference being equal to the last output of the method minus the window value. If either of blocks 60 or 62 is answered in the affirmative (i.e., the average is greater than the last output plus the window value or less than the last output minus the window value), block 64 is executed wherein the variable "last average" is set equal to the variable "average", which is then output, at block 68. However, if both of blocks 60 and 62 are answered in the negative (i.e., the average is less than the last output plus the window value but greater than the last output minus the window value), block 66 is executed wherein the variable "average" is changed to be equal to the variable "last average." The variable "average" is then output at block 68, and the method returns to block 52 where the next sample to be processed is obtained.

The method of blocks 60, 62, 64, 66, and 68 produce the same effect as the method depicted in FIG. 2. The method is reiterative, and the output of the method is held constant until the average calculated in the first filtering layer differs from this constant output by a certain value, which is determined by the window value. At this time, the output is changed to equal the average calculated by the first layer. The only differences between the window filtering methods of FIG. 2 and FIG. 3 is that two comparisons are used in FIG. 3 (which in combination are equivalent to the one comparison of FIG. 2) and the manipulation and outputting of variables is slightly different. The effect of the two are identical. Accordingly, under both embodiments, the reference (i.e., the last output) is output whenever the input is sufficiently close to the reference in either the positive or negative direction, as defined by the window value. In effect, the window value helps determine a range of deviation having a lower limit and an upper limit and which has the reference as the approximate center. The reference is output whenever the input is between the two limits (i.e., when the input is within the range of deviation); otherwise, the input is provided as the output (i.e., when the input is outside of the range of deviation). The limits may be defined by substraction and/or addition, as described in the methods of FIG. 2 and FIG. 3. Alternatively, it is contemplated that the limits may be defined by other calculations, such as, for example, multiplying the reference by a constant and/or constants.

As is illustrated in FIG. 3, the method of the present invention may be combined with other filtering methods and/or signal processing techniques. The outputs of the filtering methods can be tapped at 46 in FIG. 2 and 70 in FIG. 3, and can be utilized for a number of purposes in a wide variety of applications.

As noted earlier, the methods of FIG. 2 and FIG. 3 are preferably embodied in computer programs that utilize input statements, output statements, decision statements, assignment statements, loops, variables, arrays, and/or other statements and techniques. As can be understood by the comparison of the methods of FIG. 2 and FIG. 3, such programs may take on a number of forms, utilize a variety of variable names and commands, and be implemented in any of a number of programming languages without departing from the scope of the invention. Furthermore, the steps of the method of the present invention may be practiced in a number of orders, without departing from the scope of the invention.

Figure 4:
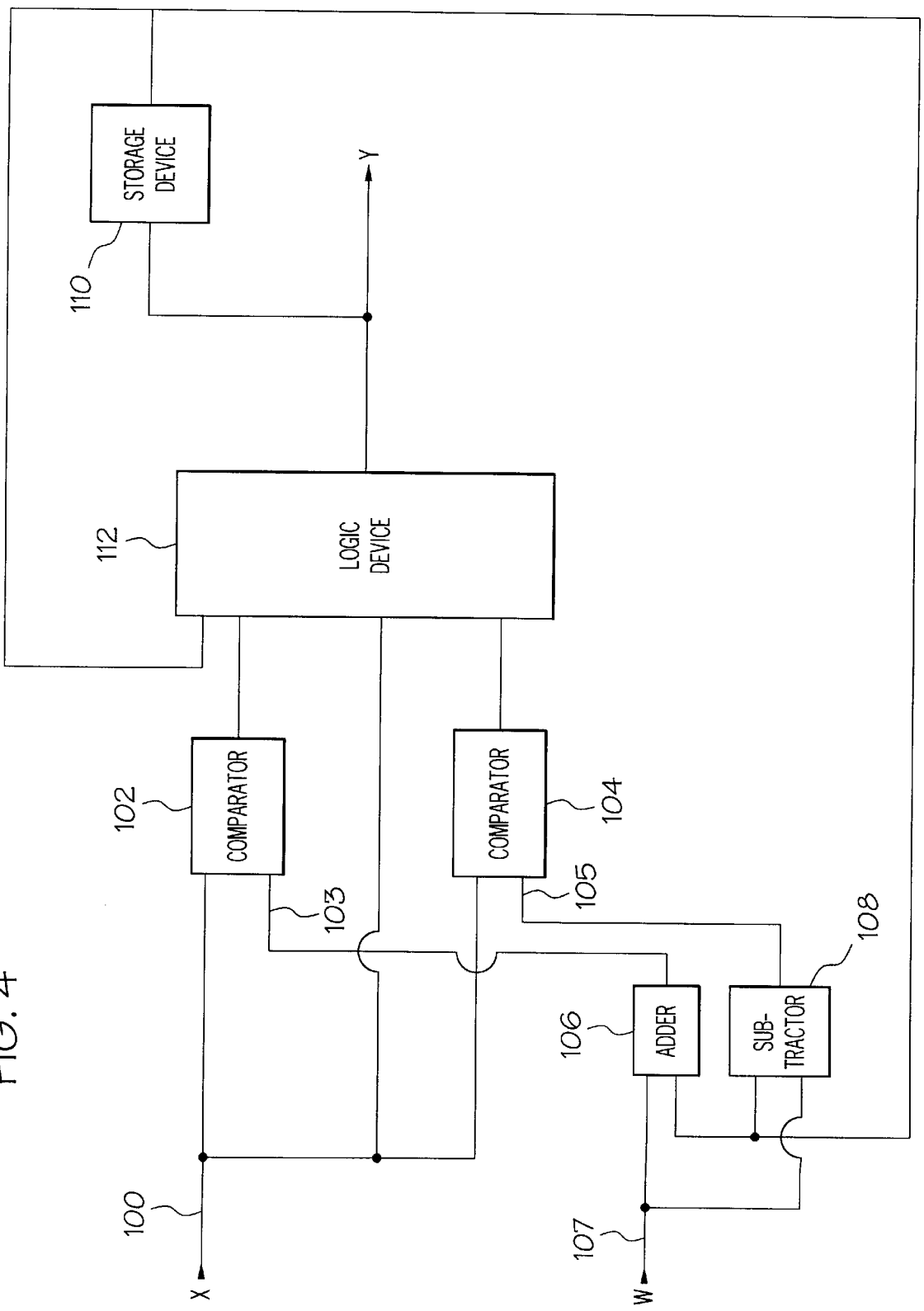
FIG. 4 is a block diagram showing an apparatus for filtering a signal using a window value input.

As indicated above, the present invention may also be implemented in hardware form by utilizing one or more electrical components or digital devices. FIG. 4 depicts a preferred hardware embodiment of the present invention. In the embodiment, the signal to be stabilized or filtered by the device is provided at input 100. This signal is fed to a pair of comparators, 102 and 104, each of which is also provided with a reference signal. Comparator 102 is provided with a maximum reference signal at input 103 while comparator 104 is provided with a minimum reference signal at input 105. The maximum reference signal provided to comparator 102 is provided by an adder 106 to which is fed a predetermined window signal, provided on line 107, and the output of a storage device 110. Similarly, the minimum reference signal provided to comparator 104 is provided by a subtractor 108 to which is fed the predetermined window signal on line 107, and the output of the storage device 110.

The adder 106 can comprise any adder known in the art, such as a binary full adder. Similarly, the comparators 102 and 104 can comprise any device known in the art to be useful for comparing two values or signals, and the subtractor 108 can comprise any device suitable for subtracting two values.

The outputs of the comparators are fed to a logic device 112, which provides an output depending upon the outputs of the comparators 102 and 104. The logic device may comprise an application specific integrated circuit, field programmable gate array, or other apparatus useful for performing logic operations. The storage device 110 is connected to the logic device 112 for storing each output of the logic device for later use, and can comprise any memory element well known in the art, such as a CMOS random access memory chip (RAM).

For each cycle of operation, the electronic adder 106 adds the predetermined window signal to the previous output of the logic element 112, which is stored in storage device 110, and provides the maximum reference signal at its output. In contrast, the electronic subtractor 108 subtracts the window signal from the previous output of the logic element 112, and provides the minimum reference signal at its output. The comparator 102 compares the magnitude of the maximum reference signal to the magnitude of the signal to be filtered, illustrated in FIG. 4 as x, and provides an output, which is either in a first state (e.g., a "high" state or logical 1), if the maximum reference signal is greater than x, or a second state (e.g., a "low" state or logical 0), if the maximum reference signal is less than x. Similarly, the comparator 104 compares the magnitude of the minimum reference signal to the magnitude of the signal x and provides an output which is in a first state if the minimum reference signal is greater than the signal x, and a second state if the minimum reference signal is less than x.

The logic device 112 is configured with control logic such that the device will provide an output that is dependent on the outputs of the comparators 102 and 104. If the signal x is less than the maximum reference signal and greater than the minimum reference signal, as indicated by the states of the comparators 102 and 104, the logic device 112 will output its previous output, which is stored in storage device 110. If the signal x is either greater than the maximum reference signal or less than the minimum reference signal, as indicated by the comparators 102 and 104, the logic device 112 will output the signal x as its output. Every output of the logic device 112 is stored in the storage device 110 for use during the next cycle by the adder 106, subtractor 108, and logic device 112.

Thus, like the method of FIG. 2 described above, the apparatus of FIG. 4 stabilizes the input signal by providing an output that is constant until an input signal is encountered which varies from the output by an amount that is greater than the window signal, at which time the new input signal becomes the output and the cycle is repeated. The window signal can be provided by the user or obtained from a memory device or other signal source. As in the method of FIG. 2, the larger the size of the window signal, the more stability provided, at the cost of less accuracy and resolution.

It should be understood that, although FIG. 4 depicts one hardware embodiment of the present invention, other embodiments are possible without departing from the scope of the invention. For example, the functioning of several of the devices described herein may be combined or otherwise consolidated into one device. Moreover, each device depicted in FIG. 4 may comprise a number of electronic devices and circuits known in the art.

Thus, the present invention provides a signal processor that can effectively correct errors in a signal, eliminate noise and distortion in a signal, and otherwise filter and stabilize the signal, without the complexities of design and operation associated with prior devices and methods. Moreover, the present invention minimizes necessary hardware, reduces processing time, and is easily adaptable to a variety of applications. In addition, the invention provides greater stability and precision than other filters known in the art.

While preferred exemplary embodiments of the present invention have been described, it is to be understood that further adaptions of the invention described herein can be accomplished by appropriate modifications by one of ordinary skill in the art without departing from the scope of the present invention. Accordingly, although preferred configurations of methods and devices embodying the present invention have been described, it is to be understood that these methods and devices may take on a wide variety of configurations and arrangements without departing from the scope of the present invention. Therefore, the scope of the present invention should be considered in terms of the following claims and should not be limited to the details of the structures and methods shown and described in the specification and drawings.

What is claimed is:

1. A method for stabilizing the output of a device, comprising the steps of:

obtaining an input sample from a feedback device in a machine, the input sample representing a measured control variable in the machine;

obtaining a previous output sample of the method;

comparing the absolute value of the difference between the previous output sample and the input sample to a window value;

providing an output sample based upon the comparison, wherein the output sample is equal to the previous output sample when the absolute value of the difference is less than the window value and wherein the output sample is equal to the input sample when the absolute value of the difference is greater than the window value; and controlling the machine using the output sample.

2. The method as recited in claim 1, further comprising the steps of:

setting the previous output sample equal to the output sample;

obtaining a second input sample at a later instance in time than the input sample, the second input sample representing the measured control variable in the machine;

comparing the window value to the absolute value of the difference between the previous output sample and the second input sample;

setting a second output sample equal to the previous output sample if the absolute value is less than the window value;

setting the second output sample equal to the second input sample if the absolute value is greater than the window value; and providing the second output sample to the machine.

3. The method as recited in claim 1, wherein the comparison step comprises the steps of:

comparing the input sample to the previous output sample plus one-half of the window value; and comparing the input sample to the previous output sample minus one-half of the window value.

4. The method as recited in claim 1 further comprising the step of:

if the absolute value of the difference is greater than the window value, setting the previous output sample to be equal to the input sample.

5. The method as recited in claim 4, wherein the steps are repeated.

6. The method as recited in claim 5, wherein the previous output sample is set equal to a predetermined number during the first repetition of the method.

7. The method as recited in claim 1, wherein, before the input obtaining step, the input sample has been previously processed.

8. The method as recited in claim 7, wherein the input sample has been previously processed by the step of:

averaging a plurality of signal samples representing the measured control variable in the machine, the average being established as the input sample.

9. The method as recited in claim 1, wherein each sample comprises a digital word comprising a plurality of bits.

10. The method as recited in claim 1, wherein the input sample corresponds to a signal in an injection molding machine.

11. The method as recited in claim 1, wherein the samples are signals.

12. A computer readable medium having encoded thereon a computer-implemented method for stabilizing the output of a device, the method comprising the steps of:

obtaining an input sample, the input sample representing a variable control parameter provided by a device in a machine;

obtaining a reference sample;

determining a relationship between the reference sample, the input sample, and a window value;

providing an output sample based upon the relationship, wherein the output sample is equal to the reference sample only if the input sample deviates from the reference sample in either the positive or negative direction by less than the window value, and wherein the output sample is equal to the input sample only if the input sample deviates from the reference sample in either direction by more than the window value;

transmitting the output sample to the machine; and if the input sample deviates from the reference sample in either direction by more than the window value, setting the reference sample equal to the input sample.

13. The computer readable medium as recited in claim 12, further comprising the step of:

averaging a plurality of samples obtained from the device, the average being established as the input sample.

14. The computer-readable medium as recited in claim 12, wherein the determining step comprises the step of:

comparing the window value to the absolute value of the difference between the reference sample and the input sample, and wherein the providing step comprises the steps of:

setting the output sample equal to the reference sample if the window value is greater than the absolute value;

setting the output sample equal to the input sample if the window value is less than the absolute value; and providing the output sample.

15. An apparatus for stabilizing the output of a device, comprising:

an output storage element configured to provide a stored output signal;

an evaluation element configured to receive a window signal, a device output signal from a control device in a machine, and the stored output signal, and to provide an evaluation element output signal, wherein the evaluation element output signal is equivalent to the device output signal if the absolute value of the difference between the device output signal and the stored output signal is greater than the window signal, and wherein the evaluation element output signal is equivalent to the stored output signal if the absolute value of the difference between the device output signal and the stored output signal is less than the window signal; and a controller in communication with the evaluation element and configured to control a machine using the evaluation element output signal.

16. The device as recited in claim 15, wherein the evaluation element comprises:

a comparison element adapted to receive a minimum reference signal, a maximum reference signal, and the device output signal, and to provide an output signal having a first state if the device output signal is less than minimum reference signal, a second state if the device output signal is between the minimum and maximum reference signals, and a third state if the device output signal is greater than the maximum reference signal, wherein the minimum reference value is equal to the stored output signal minus the window signal, and wherein the maximum reference signal is equal to the stored output signal plus the window signal; and a logic element adapted to receive the stored output signal and the comparison element output signal and to provide the evaluation element output signal, wherein the evaluation element output signal is equal to the stored output signal if the comparison element output signal is in the second state, and wherein the evaluation element output signal is equal to the device output signal if the comparison element output signal is in the first or third states, the stored output signal comprising the previous evaluation element output signal.

17. The apparatus as recited in claim 16, wherein the comparison element comprises:

a first comparator having a first input adapted to receive the device output signal and a second input for receiving the minimum reference signal;

a second comparator having a first input adapted to receive the device output signal and a second input for receiving the maximum reference signal;

an adder adapted to receive the stored output signal and the window signal, and for providing the maximum reference signal by adding the window signal to the stored output signal; and a subtractor adapted to receive the stored output signal and the window signal, and for providing the minimum reference signal by subtracting the window signal from the stored output signal.

18. The apparatus as recited in claim 15, further comprising:

an injection molding machine to provide the device output signal.

19. The apparatus as recited in claim 15, wherein the evaluation element comprises:

a calculation element adapted to calculate the difference between the stored output signal and the device output signal;

a comparison element adapted to receive the output of the calculation element and for comparing the difference to the window signal, the comparison element providing an output having a first state if the difference is less than the window signal and a second state if the difference is greater than the window signal; and a logic element adapted to receive the output of the comparison element, wherein the logic element sets the evaluation element output signal equal to the stored output signal if the comparison element output is in the first state, and wherein the logic element sets the evaluation element output signal equal to the device output signal if the comparison element output is in the second state.

20. A computer readable medium having encoded thereon a computer-implemented method for stabilizing the output of a device, the method comprising the steps of:

obtaining an input signal from a device in a machine, the input signal representing a control variable in the machine;

obtaining a previous output signal of the method;

calculating a lower limit based upon the previous output signal and a first constant, the lower limit being less than the previous output signal;

calculating an upper limit based upon the previous output signal and a second constant, the upper limit being greater than the previous output signal;

comparing the input signal to the lower limit;

comparing the input signal to the upper limit;

setting an output signal equal to the previous output signal when the input signal is less than the upper limit and greater than the lower limit;

setting the output signal equal to the input signal when the input signal is less than the lower limit or greater than the upper limit;

providing the output signal to the machine; and controlling the machine using the output signal.

21. The computer readable medium as recited in claim 20, wherein the first constant is equal to the second constant, wherein the lower limit is calculated by subtracting the first constant from the previous output, and wherein the upper limit is calculated by adding the second constant to the previous output.

22. The computer readable medium as recited in claim 20, further comprising the step of:

averaging a plurality of signals obtained from a feedback device by adding the plurality of signals and dividing by the number of signals added, the average being established as the input signal.

23. The computer readable medium as recited in claim 20, wherein the lower limit is calculated by multiplying the previous output by the first constant, and wherein the upper limit is calculated by multiplying the previous output by the second constant.

* * * * *